(12) United States Patent
Tsuduki et al.

(10) Patent No.: US 9,209,330 B2
(45) Date of Patent: Dec. 8, 2015

(54) SEMICONDUCTOR DEVICE, METHOD OF MANUFACTURING THE SAME, AND CAMERA

(71) Applicant: CANON KABUSHIKI KAISHA, Tokyo (JP)

(72) Inventors: Koji Tsuduki, Kawasaki (JP); Yasushi Kurihara, Komae (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 55 days.

(21) Appl. No.: 13/927,577

(22) Filed: Jun. 26, 2013

(65) Prior Publication Data

US 2014/0008753 A1    Jan. 9, 2014

(30) Foreign Application Priority Data

Jul. 6, 2012  (JP) .................................. 2012-153020

(51) Int. Cl.

| | |
|---|---|
| *H01L 31/0203* | (2014.01) |
| *H01L 21/00* | (2006.01) |
| *H01L 31/0236* | (2006.01) |
| *H01L 31/18* | (2006.01) |
| *H01L 27/146* | (2006.01) |

(52) U.S. Cl.
CPC .... *H01L 31/02366* (2013.01); *H01L 27/14618* (2013.01); *H01L 31/186* (2013.01); *H01L 2924/0002* (2013.01)

(58) Field of Classification Search
USPC ......... 257/774, 522, 419, 773, 758, 737, 499, 257/762, 764, 506; 438/57, 64, 65, 66, 67
See application file for complete search history.

(56) References Cited

U.S. PATENT DOCUMENTS

| | | | |
|---|---|---|---|
| 6,773,964 B2 | 8/2004 | Fan | 438/122 |
| 7,955,903 B2 | 6/2011 | Tsuduki et al. | 438/125 |
| 2004/0079789 A1 | 4/2004 | Hasegawa et al. | 228/124.6 |
| 2009/0140405 A1* | 6/2009 | Maruo et al. | 257/680 |
| 2010/0149410 A1* | 6/2010 | Matsuzawa | 348/374 |

(Continued)

FOREIGN PATENT DOCUMENTS

| | | |
|---|---|---|
| CN | 1497641 | 5/2004 |
| CN | 1685500 | 10/2005 |
| CN | 102315365 | 1/2012 |
| JP | 2002-124589 | 4/2002 |
| JP | 2004-342992 | 12/2004 |
| JP | 2008-300698 | 12/2008 |

(Continued)

OTHER PUBLICATIONS

Office Action issued Sep. 25, 2015 in counterpart P.R. China patent application 201310280236.0, with translation.

*Primary Examiner* — Robert Bachner
*Assistant Examiner* — Moin Rahman
(74) *Attorney, Agent, or Firm* — Fitzpatrick, Cella, Harper & Scinto

(57) ABSTRACT

A method of manufacturing a semiconductor device including a first member including a chip mounting region and a peripheral region, a semiconductor chip mounted in the chip mounting region, and a second member fixed to the first member to cover the semiconductor chip, includes adhering, to the second member, the peripheral region of the first member in a state that the semiconductor chip is mounted in the chip mounting region, using an adhesive, and generating a stress between the first member and the second member, after the adhesive starts to cure, to locally form a gap in at least one of a portion between the first member and the adhesive, and a portion between the second member and the adhesive.

12 Claims, 10 Drawing Sheets

(56) References Cited

U.S. PATENT DOCUMENTS

2012/0001312 A1 1/2012 Nishino et al. ............... 257/676
2012/0256319 A1* 10/2012 Mitsuhashi ................. 257/774

FOREIGN PATENT DOCUMENTS

| JP | 2009-302556 | 12/2009 |
| JP | 2010-141123 | 6/2010 |

* cited by examiner

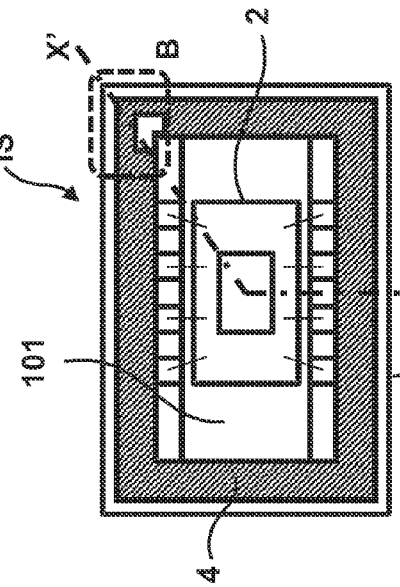
FIG. 4A
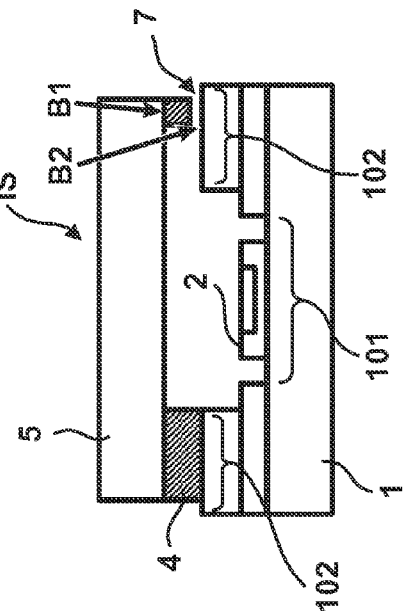
FIG. 4C
FIG. 4B
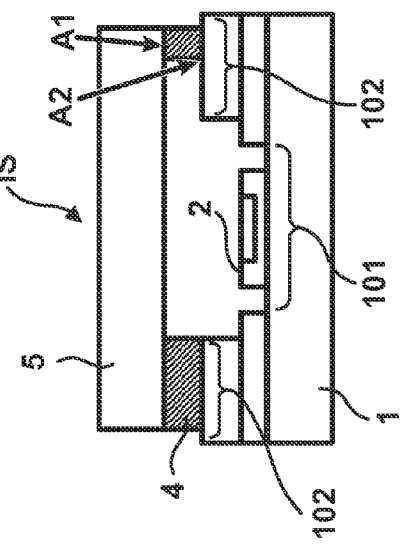
FIG. 4D

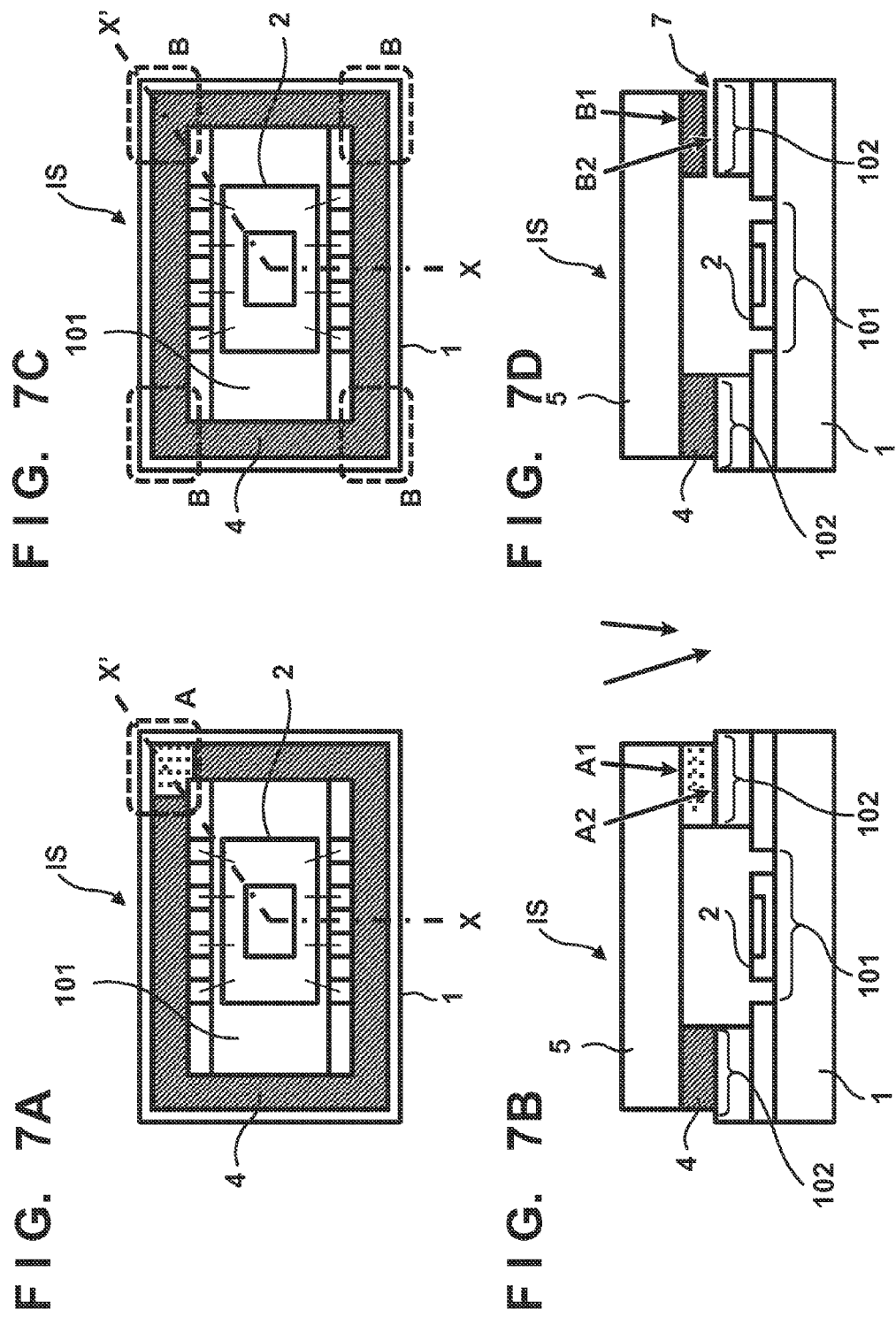

F I G. 10A
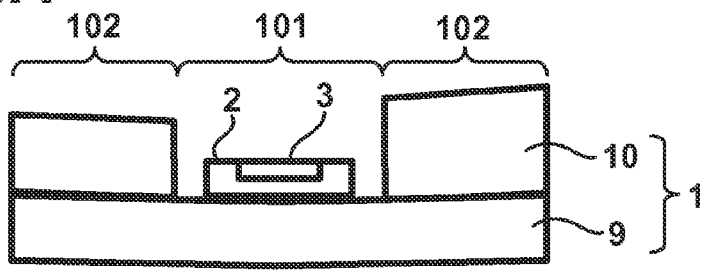
F I G. 10B
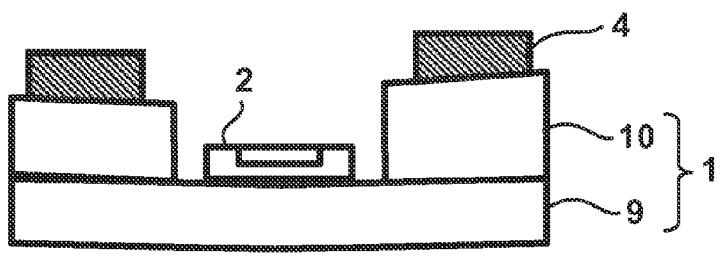
F I G. 10C
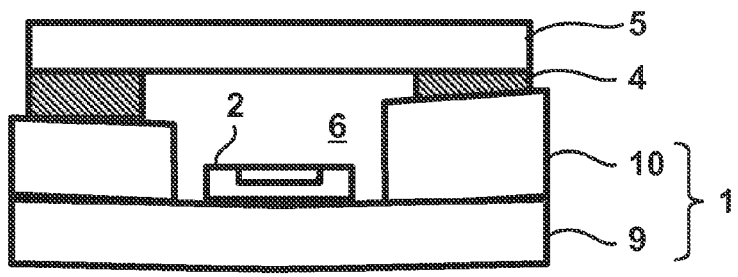
F I G. 10D
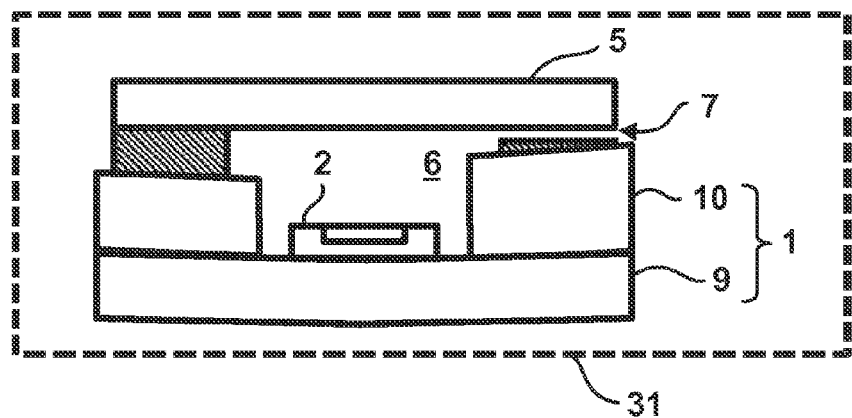

SEMICONDUCTOR DEVICE, METHOD OF MANUFACTURING THE SAME, AND CAMERA

BACKGROUND OF THE INVENTION

1. Field of the Invention

The present invention relates to a semiconductor device, a method of manufacturing the same, and a camera.

2. Description of the Related Art

A solid-state image sensor such as a CCD or CMOS sensor used in a digital camera or cellular phone may have a structure in which a solid-state image sensing chip is mounted in a package having a cavity, wires are connected to the chip by wiring connection such as wire bonding, and the chip with the wiring connection is airtightly sealed by fixing a light transparent lid member using an adhesive.

In the solid-state image sensor, a phenomenon in which depending on the use environment or the elapsed time, moisture gradually enters the interior of the package through the adhesive portion to increase the amount of vapor of the interior may occur. Therefore, when the solid-state image sensor reciprocally moves between environments with a large difference in temperature, condensation occurs inside the light transparent lid member or on the image sensing chip, so a desired image cannot be obtained.

Japanese Patent Laid-Open No. 2002-124589 discloses a method of locally providing a portion, that is not coated with an adhesive, in the adhesive portion between the package body and the glass plate to allow air circulation between the interior and exterior of the package using this portion as a ventilation portion.

If the thickness of an adhesive used to adhere the package body and the glass plate is too small, the stress resistance lowers, and the adhesive becomes prone to peeling upon a change in ambient temperature; or if this thickness is too large, the moisture resistance lowers. For this reason, the thickness of the adhesive is normally adjusted to about 5 to 30 µm. Therefore, as in Japanese Patent Laid-Open No. 2002-124589, when a portion that is not coated with an adhesive is locally provided in the adhesive portion between the package body and the glass plate, the size of the gap between the package body and the glass plate becomes 5 to 30 µm, so particles with a size equal to or smaller than 5 to 30 µm may enter the internal space of the package. Since the pixel size in the recent solid-state image sensor is about 1 to 5 µm, particles with a size larger than the pixel size may adhere onto a pixel.

The entrance of particles to the internal space of the package may be problematic in a semiconductor device such as an LED as well.

SUMMARY OF THE INVENTION

The present invention provides a technique advantageous in terms of suppressing the entrance of particles to the internal space, in which a semiconductor chip is arranged, while allowing ventilation between the internal and external spaces.

The first aspect of the present invention provides a method of manufacturing a semiconductor device including a first member including a chip mounting region and a peripheral region surrounding the chip mounting region, a semiconductor chip mounted in the chip mounting region, and a second member fixed to the first member to cover the semiconductor chip, the method comprising: an adhering step of adhering, to the second member, the peripheral region of the first member in a state that the semiconductor chip is mounted in the chip mounting region, using an adhesive; and a stress applying step of generating a stress between the first member and the second member, after the adhesive starts to cure in the adhering step, to locally form a gap in at least one of a portion between the first member and the adhesive, and a portion between the second member and the adhesive to allow an internal space of the peripheral region to communicate with an external space of the peripheral region.

The second aspect of the present invention provides a semiconductor device including a first member including a chip mounting region and a peripheral region surrounding the chip mounting region, a semiconductor chip mounted in the chip mounting region, and a second member which covers the semiconductor chip, comprising: an adhesive arranged in a frame shape between the peripheral region and the second member to surround an entire periphery of the chip mounting region so as to bond the first member and the second member with each other, wherein a gap is locally formed in at least one of a portion between the first member and the adhesive arranged in the frame shape, and a portion between the second member and the adhesive arranged in the frame shape to allow an internal space of the peripheral region to communicate with an external space of the peripheral region.

The third aspect of the present invention provides a camera comprising: a semiconductor device defined as the first aspect of the present invention; and a processing unit which processes a signal output from the semiconductor device.

Further features of the present invention will become apparent from the following description of exemplary embodiments with reference to the attached drawings.

BRIEF DESCRIPTION OF THE DRAWINGS

FIGS. 4A to 4D are views showing a semiconductor device and a method of manufacturing the same according to the second embodiment;

FIGS. 7A to 7D are views showing a semiconductor device and a method of manufacturing the same according to the fifth embodiment;

FIGS. 10A to 10D are views showing the semiconductor device and the method of manufacturing the same according to the seventh embodiment.

DESCRIPTION OF THE EMBODIMENTS

Figure 1A:
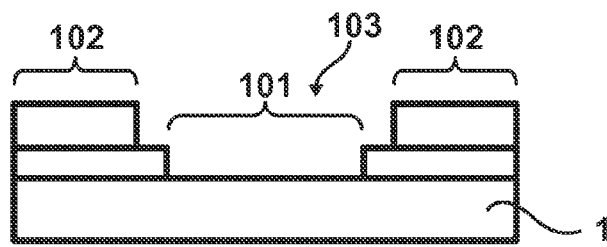
FIGS. 1A to 1E are views showing a semiconductor device and a method of manufacturing the same according to the first embodiment.

Embodiments of the present invention will be described below with reference to the accompanying drawings.

First Embodiment

A semiconductor device and a method of manufacturing the same according to the first embodiment of the present invention will be described with reference to FIGS. 1A to 1E. A solid-state image sensor IS and a method of manufacturing the same will be exemplified herein. The configuration of the solid-state image sensor IS will be described first. The solid-state image sensor IS includes a first member 1 having a chip mounting region 101 and a peripheral region 102 surrounding it, a solid-state image sensing chip (semiconductor chip) 2 mounted in the chip mounting region 101, and a second member 5 fixed to the first member 1 to cover the solid-state image sensing chip 2. The peripheral region 102 of the first member 1, and the second member 5 are adhered to each other using an adhesive 4. A gap 7 is locally formed in at least one of the portion between the first member 1 and the adhesive 4, and the portion between the second member 5 and the adhesive 4 to allow a space (to be referred to as the internal space hereinafter) 6 inside the peripheral region 102 to communicate with a space (to be referred to as the external space hereinafter) outside the peripheral region 102. The solid-state image sensing chip 2 is arranged in the internal space 6. The internal space 6 is, for example, a space corresponding to the interior of orthogonal projection of the peripheral region 102 onto a plane including the surface of the chip mounting region 101 of the first member 1.

A method of manufacturing a solid-state image sensor IS will be described below. First, in a step shown in FIG. 1A, a first member (base) 1 is prepared. The first member 1 includes a chip mounting region 101 for mounting a solid-state image sensing chip 2, and a peripheral region 102 which surrounds the chip mounting region 101. The first member 1 has a concave portion 103 for accommodating the solid-state image sensing chip 2, and the chip mounting region 101 can be arranged on the bottom surface of the concave portion 103. The first member 1 can be formed by, for example, a ceramic, glass epoxy, or a resin material such as plastic resin. Although the first member 1 has the concave portion 103 in an example shown in FIGS. 1A to 1E, it need not always have the concave portion 103. In the latter case, the second member 5 can have a shape defined by a concave portion.

Figure 1B:
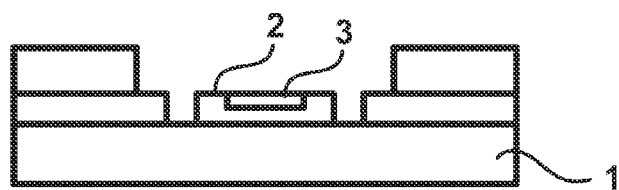

In a step shown in FIG. 1B, a solid-state image sensing chip 2 is mounted in the chip mounting region 101 of the first member 1. The solid-state image sensing chip 2 includes a pixel region 3 having a plurality of light receiving elements (photoelectric conversion elements). The pixel region 3 can further include, for example, a color filter, planarizing film, and microlens. The solid-state image sensing chip 2 can be, for example, a CCD image sensor or a CMOS image sensor. A bonding pad (not shown) of the solid-state image sensing chip 2, and a lead (not shown) provided on the first member 1 can be connected to each other via an electrically conductive member (not shown) such as a metal wire. The medium of this connection operation may be, for example, a feedthrough electrode, and is not limited to a metal wire.

Figure 1C:
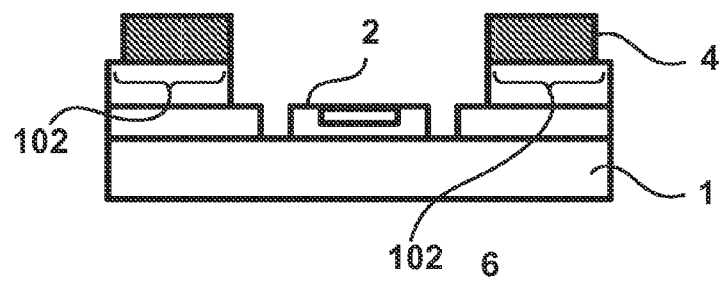
Figure 1D:
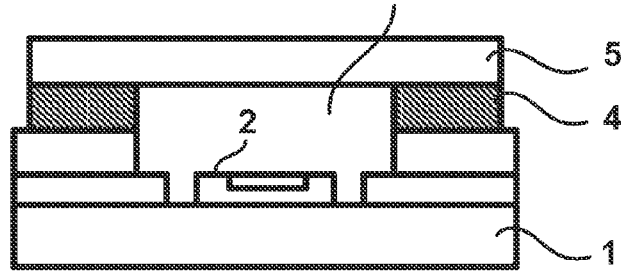

An adhering step illustrated in FIGS. 1C and 1D is performed. First, in a step shown in FIG. 1C, an adhesive 4 is applied to the peripheral region 102 of the first member 1 to surround the entire periphery of the chip mounting region 101. That is, an adhesive 4 is applied so that its application region forms a frame region. The adhesive 4 has a frame shape. The frame shape need only be a closed-loop shape, and may be, for example, a rectangular shape or a shape other than a rectangular shape. The adhesive 4 can be an ultraviolet-curing resin which cures upon receiving ultraviolet rays, or a thermoset resin which cures upon heating, but may be another type of adhesive. The adhesive 4 can be applied using, for example, the print method or the dispenser method. The adhesive 4 may be applied to the second member 5 in place of the first member 1, or applied to both the first member 1 and second member 5.

In a step shown in FIG. 1D, the second member 5 is arranged on the first member 1 (this step can be called an arranging step). With this operation, a structure in which the adhesive 4 is arranged between the peripheral region 102 of the first member 1, and the second member 5 to surround the entire periphery of the chip mounting region 101 can be obtained. Again in the step shown in FIG. 1D, the adhesive 4 is cured to adhere the first member 1 and the second member 5 to each other (this step can be called a curing step). Note that if the adhesive 4 is an ultraviolet-curing resin, it can be cured by irradiation with ultraviolet rays. If the adhesive 4 is a thermoset resin, it can be cured by heating. The second member 5 is a light transparent member, and can be formed by, for example, glass or crystal. By adhering the first member 1 and the second member 5 to each other, the internal space 6 and the external space are separated from each other.

Figure 1E:
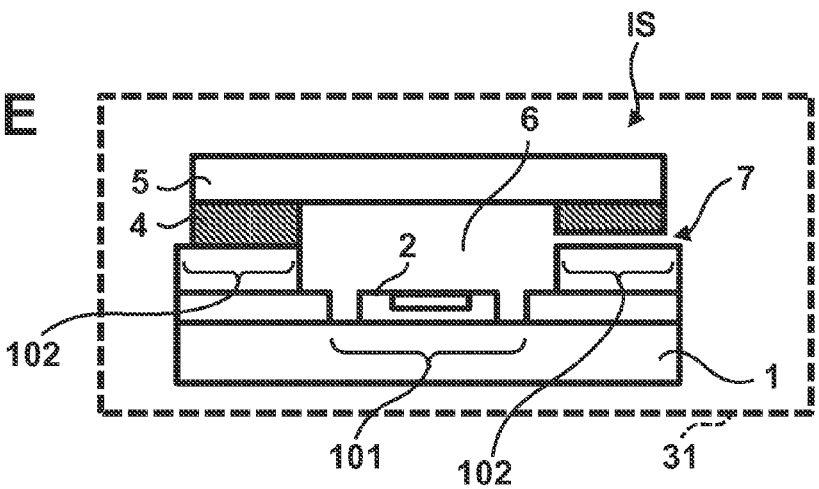

In a step shown in FIG. 1E, a stress is generated between the first member 1 and the second member 5 (this step can be called a stress applying step). With this operation, a gap 7 is locally formed in at least one of the portion between the first member 1 and the adhesive 4, and the portion between the second member 5 and the adhesive 4 to allow the internal space 6 of the peripheral region 102 to communicate with the external space of the peripheral region 102. A stress can be generated between the first member 1 and the second member 5 by heating at least one of the first member 1 and second member 5. For example, a stress can be generated by heating, in a heating furnace 31, a package including the first member 1 and second member 5 which accommodate the solid-state image sensing chip 2.

By heating the package including the first member 1 and second member 5 which accommodate the solid-state image sensing chip 2, a stress is generated between the first member 1 and the second member 5 due to the difference in coefficient of linear expansion between the first member 1 and the second member 5. This stress also acts between the first member 1 and the second member 5 and between the second member 5 and the adhesive 4. With this operation, a shearing stress is applied between the first member 1 and the adhesive 4 and between the second member 5 and the adhesive 4. Due to this shearing stress, at least one of the portion between the first member 1 and the adhesive 4, and that between the second member 5 and the adhesive 4 locally peels (the adhesive interface breaks), so the gap 7 is formed.

If the adhesive 4 is a thermoset resin, the gap 7 can be formed by applying a temperature higher than the heat curing temperature of the adhesive 4 to the adhesive 4. On the other hand, it is necessary to set a temperature at which the color filter, microlens, and other members do not suffer from, for example, deformation or discoloration. For this reason, the temperature at which a stress is generated to form the gap 7 preferably falls within the range of 100° C. to 300° C. If the adhesive 4 is an ultraviolet-curing resin, a temperature that falls within the same range can be set as well.

The stress applying step may be started after the end of the adhering step, but may be started before the end of the adhering step. However, if the stress applying step is started before the end of the adhering step, this must be done after the adhesive 4 starts to cure in order to cause partial peeling in at least one of the portion between the first member 1 and the adhesive 4, and that between the second member 5 and the adhesive 4.

In the stress applying step, a stress may be generated between, for example, the first member 1 and the second member 5 by applying a force to the first member 1 and second member 5 so that the second member 5 moves relative to the first member 1.

Figure 2A:
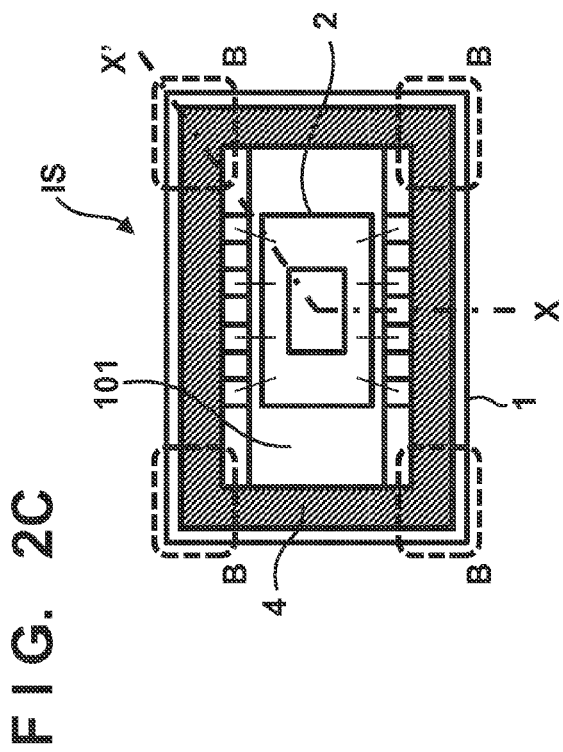
FIGS. 2A to 2D are views showing the semiconductor device and the method of manufacturing the same according to the first embodiment.
Figure 2B:
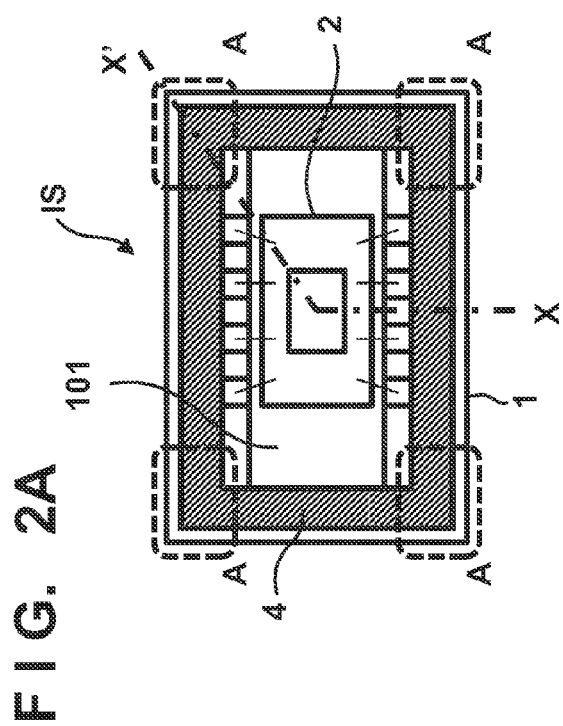
Figure 2C:
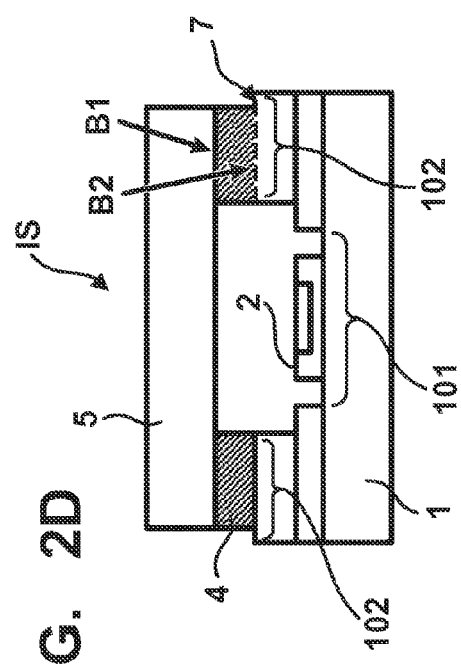

A method of forming a gap by applying a stress will be described in more detail below. FIG. 2A is a plan view of a solid-state image sensor IS before the stress applying step, and FIG. 2B is a sectional view (a sectional view taken along a line X-X' in FIG. 2A) of the solid-state image sensor IS before the stress applying step. FIG. 2C is a plan view of the solid-state image sensor IS after the stress applying step, and FIG. 2D is a sectional view (a sectional view taken along a line X-X' in FIG. 2C) of the solid-state image sensor IS after the stress applying step.

As shown in FIGS. 2A and 2B, before the stress applying step, the first member 1 and the second member 5 are adhered (bonded) to each other by the adhesive 4 in the region where the adhesive 4 is arranged. The adhesive 4 is arranged between the peripheral region 102 of the first member 1, and the second member 5 to surround the entire periphery of the chip mounting region 101. A region A is the region where peeling is expected to be caused by applying a stress (for example, applying a stress by heating). An interface A1 is the interface between the second member 5 and the adhesive 4, and an interface A2 is the interface between the first member 1 and the adhesive 4.

Figure 2D:
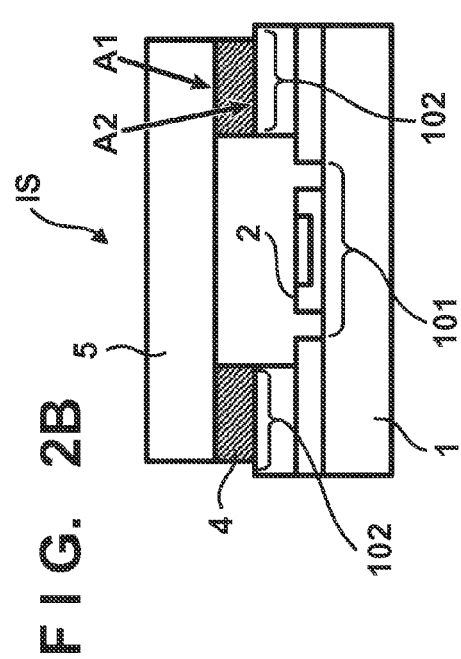

As shown in FIGS. 2C and 2D, after the stress applying step, the gap 7 is already locally formed in at least one of the portion between the first member 1 and the adhesive 4, and that between the second member 5 and the adhesive 4. The internal space 6 and external space communicate with each other through the gap 7. A region B is the region where the adhesive 4 in the region A has peeled off the first member 1 and/or the second member 5, that is, the gap 7 is formed. In an example shown in FIGS. 2A to 2D, in the region B where the gap 7 is formed, the adhesive 4 has peeled off the first member 1 and/or the second member 5, but is partially in contact with the first member 1 and/or the second member 5.

In a region, other than the region B, of the adhesive region where the adhesive 4 is arranged, the first member 1 and the second member 5 are adhered to each other by the adhesive 4. Even after the stress applying step, the adhesive 4 is arranged between the peripheral region 102 of the first member 1, and the second member 5 to surround the entire periphery of the chip mounting region 101 (that is, to maintain a frame region). Note that FIG. 2D schematically shows the structure in which the adhesive 4 peels in part (a portion indicated by a dotted line) of an interface B2 of interfaces B1 and B2 to form the gap 7. At least one region B need only be formed. The region B is easily formed at, for example, a corner portion.

Even if moisture enters the internal space 6, it can be discharged to the external space through the gap 7 formed in the region B. Although the gap 7 is formed as the adhesive 4 peels off the first member 1 and/or the second member 5 in the first embodiment, the adhesive 4 is arranged to surround the solid-state image sensing chip 2 (that is, to form a frame region). Hence, compared to the case wherein an adhesive is partially removed, or a portion not coated with an adhesive is formed, the size of the gap is very small. Therefore, the entrance of particles from the external space to the internal space 6 is suppressed.

Figure 3A:
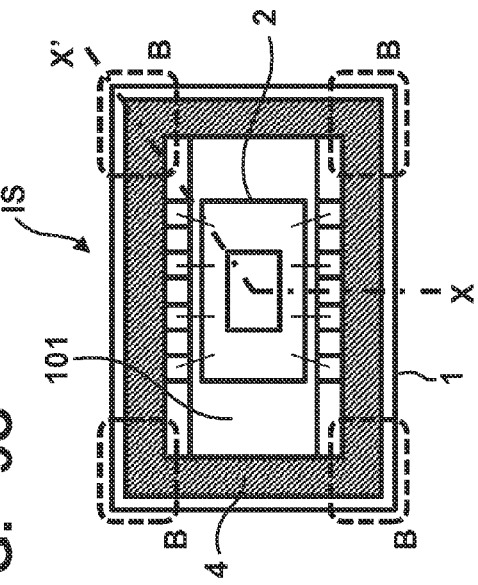
FIGS. 3A to 3D are views showing the semiconductor device and the method of manufacturing the same according to the first embodiment.
Figure 3C:
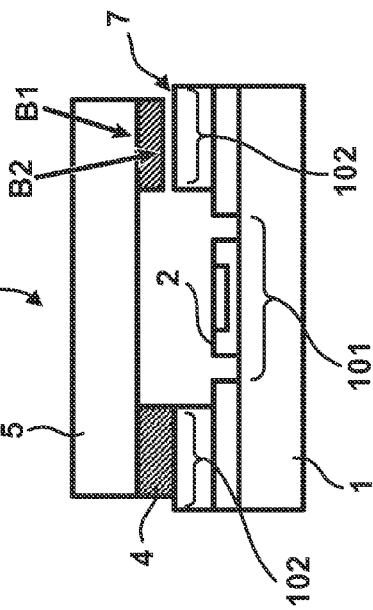
Figure 3B:
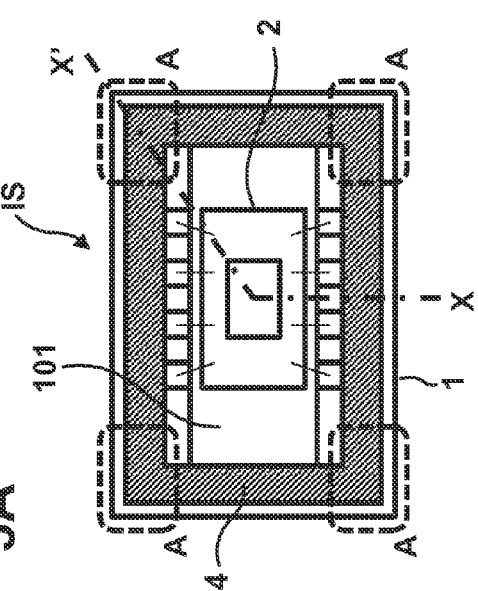

Another example of a gap formed in a stress applying step will be described below with reference to FIGS. 3A to 3D. FIG. 3A is a plan view of a solid-state image sensor IS before the stress applying step, and FIG. 3B is a sectional view (a sectional view taken along a line X-X' in FIG. 3A) of the solid-state image sensor IS before the stress applying step. FIG. 3C is a plan view of the solid-state image sensor IS after the stress applying step, and FIG. 3D is a sectional view (a sectional view taken along a line X-X' in FIG. 3C) of the solid-state image sensor IS after the stress applying step.

Figure 3D:
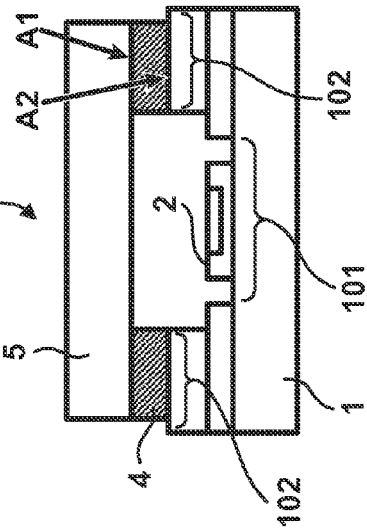

As shown in FIGS. 3C and 3D, after the stress applying step, the gap 7 is already locally formed in at least one of the portion between the first member 1 and the adhesive 4, and the portion between the second member 5 and the adhesive 4. In the region B, the adhesive 4 in the region A has peeled off the first member 1 and/or the second member 5, that is, the gap 7 is formed. In an example shown in FIGS. 3A to 3D, in the region B where the gap 7 is formed, the adhesive 4 has peeled off the first member 1 and/or the second member 5, and is completely separated from the first member 1 and/or the second member 5.

In an example shown in FIGS. 3A to 3D, the size of the gap is larger than an example shown in FIGS. 2A to 2D, but is considerably smaller than the case wherein an adhesive is partially removed or a portion not coated with an adhesive is formed. Therefore, the entrance of particles from the external space to the internal space 6 is suppressed.

Second Embodiment

The second embodiment of the present invention will be described with reference to FIGS. 4A to 4D. Note that details which are not particularly referred to in the second embodiment can be the same as in the first embodiment. In the second embodiment, the adhesive region where an adhesive is arranged is improved to facilitate the formation of a gap in a stress applying step.

FIG. 4A is a plan view of a solid-state image sensor IS before the stress applying step, and FIG. 4B is a sectional view (a sectional view taken along a line X-X' in FIG. 4A) of the solid-state image sensor IS before the stress applying step. FIG. 4C is a plan view of the solid-state image sensor IS after the stress applying step, and FIG. 4D is a sectional view (a sectional view taken along a line X-X' in FIG. 4C) of the solid-state image sensor IS after the stress applying step.

A region A is the region, where a gap 7 is to be formed, of a frame region where an adhesive 4 is arranged. A region B is the region where the adhesive 4 in the region A has peeled off a first member 1 and/or a second member 5, that is, the gap 7 is formed. In the second embodiment, the adhesive 4 is arranged so that the width of the adhesive 4 in the region A, where the gap 7 is to be formed, of a frame region where the adhesive 4 is arranged is smaller than that of the adhesive 4 in another region (the remaining region) of the frame region. With this arrangement, the gap 7 can be easily formed in the region B. Also, it becomes easy to limit the region where the gap 7 is formed to fall within the region A. Note that the region A need not always be a corner portion, and at least one region A need only be formed.

Third Embodiment

The third embodiment of the present invention will be described with reference to FIGS. 5A to 5D. Note that details which are not particularly referred to in the third embodiment can be the same as in the first embodiment. In the third embodiment, the interval between a peripheral region 102 of a first member 1, and a second member 5 is determined to facilitate the formation of a gap in a stress applying step.

Figure 5A:
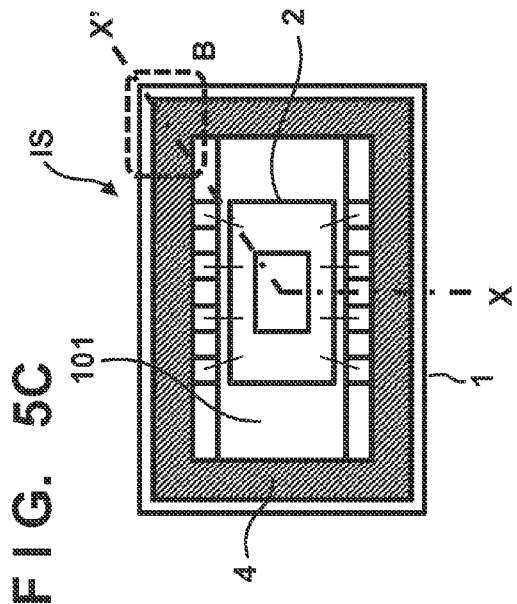
FIGS. 5A to 5D are views showing a semiconductor device and a method of manufacturing the same according to the third embodiment.
Figure 5B:
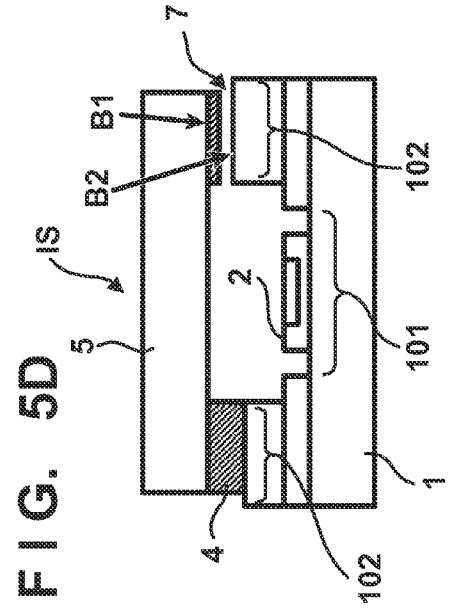
Figure 5C:
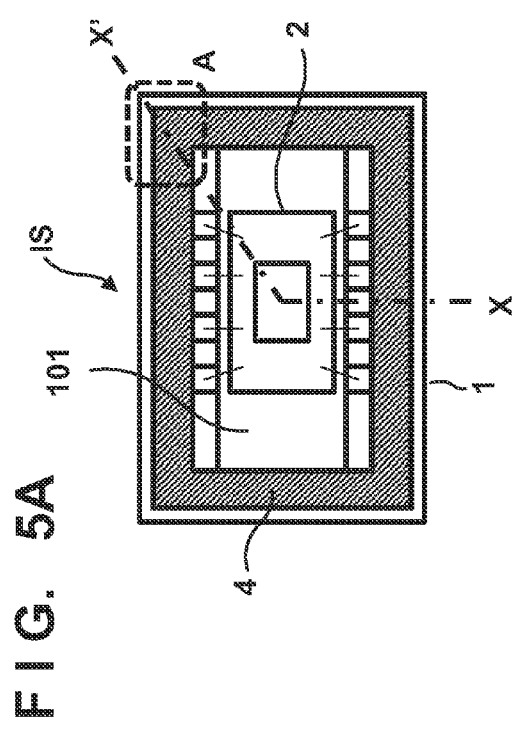
Figure 5D:
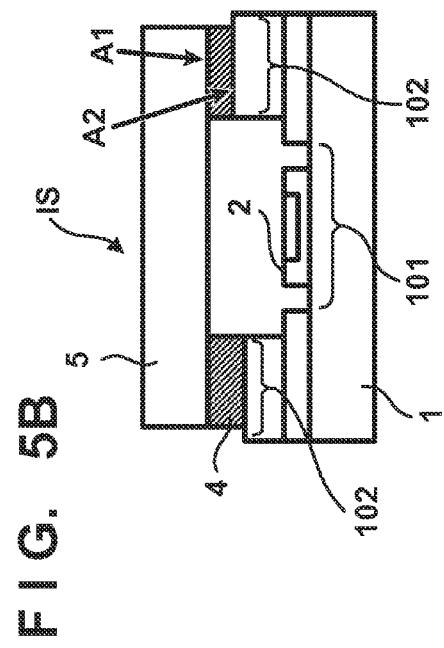

FIG. 5A is a plan view of a solid-state image sensor IS before the stress applying step, and FIG. 5B is a sectional view (a sectional view taken along a line X-X' in FIG. 5A) of the solid-state image sensor IS before the stress applying step. FIG. 5C is a plan view of the solid-state image sensor IS after the stress applying step, and FIG. 5D is a sectional view (a sectional view taken along a line X-X' in FIG. 5C) of the solid-state image sensor IS after the stress applying step.

A region A is the region, where a gap 7 is to be formed, of a frame region where an adhesive 4 is arranged. A region B is the region where the adhesive 4 in the region A has peeled off the first member 1 and/or the second member 5, that is, the gap 7 is formed. In the third embodiment, the interval between the peripheral region 102 and the second member 5 in the region A, where the gap 7 is to be formed, of a frame region where the adhesive 4 is arranged is smaller than that between the peripheral region 102 and the second member 5 in the remaining region of the frame region. With this arrangement, the expected amount of deformation of the adhesive 4 in the region A where the gap 7 is to be formed is smaller than that in the remaining region, so the gap 7 can be easily formed in the region B. Also, it becomes easy to limit the region where the gap 7 is formed to fall within the region A. The interval between the peripheral region 102 of the first member 1, and the second member 5 can be adjusted by adjusting at least one of the surface shape of the peripheral region 102 and that of the second member 5. For example, this interval can be adjusted by (a) making the peripheral region 102 project more in the region A than in the remaining region, (b) making the second member 5 project more in the region A than in the remaining region, or (c) performing both these operations.

Fourth Embodiment

The fourth embodiment of the present invention will be described with reference to FIGS. 6A to 6D. Note that details which are not particularly referred to in the fourth embodiment can be the same as in the first embodiment. In the fourth embodiment, the surface roughness of a peripheral region 102 of a first member 1 is improved to facilitate the formation of a gap in a stress applying step.

Figure 6A:
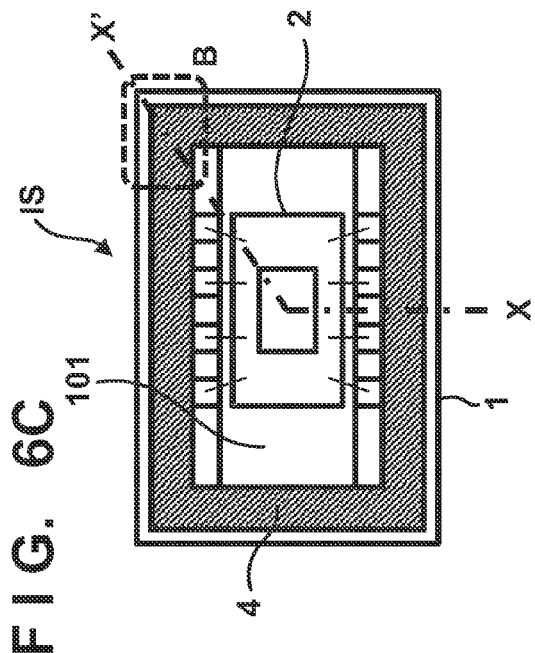
FIGS. 6A to 6D are views showing a semiconductor device and a method of manufacturing the same according to the fourth embodiment.
Figure 6B:
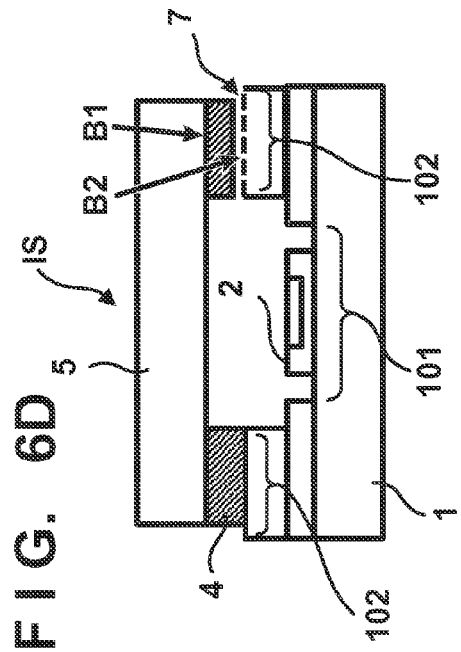
Figure 6C:
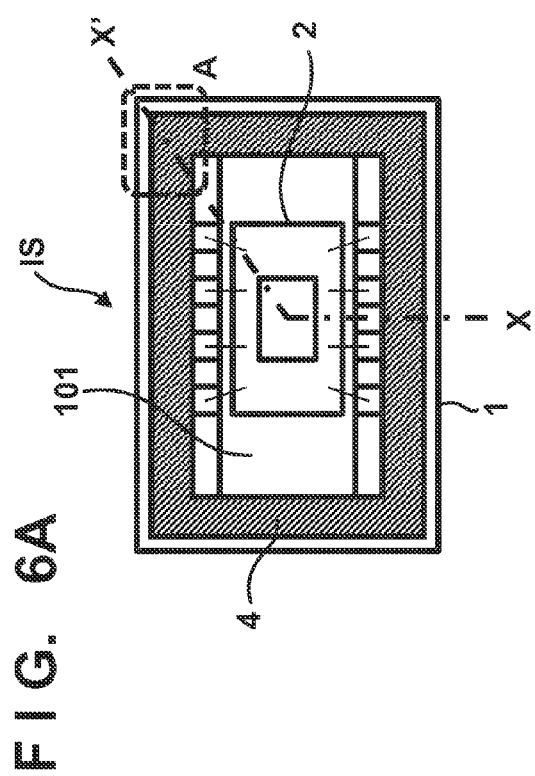
Figure 6D:
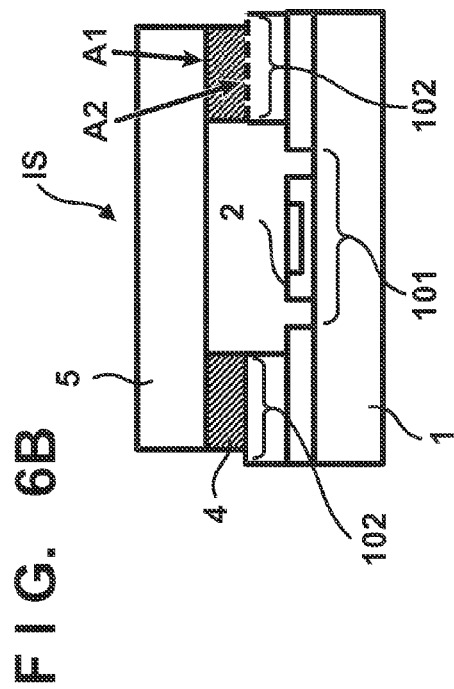

FIG. 6A is a plan view of a solid-state image sensor IS before the stress applying step, and FIG. 6B is a sectional view (a sectional view taken along a line X-X' in FIG. 6A) of the solid-state image sensor IS before the stress applying step. FIG. 6C is a plan view of the solid-state image sensor IS after the stress applying step, and FIG. 6D is a sectional view (a sectional view taken along a line X-X' in FIG. 6C) of the solid-state image sensor IS after the stress applying step.

A region A is the region, where a gap 7 is to be formed, of a frame region where an adhesive 4 is arranged. A region B is the region where the adhesive 4 in the region A has peeled off the first member 1, that is, the gap 7 is formed. In the fourth embodiment, the surface roughness of the peripheral region 102 in the region A, where the gap 7 is to be formed, of a frame region where the adhesive 4 is arranged is lower than that of the peripheral region 102 in the remaining region of the frame region. With this arrangement, the bonding strength between the peripheral region 102 and the adhesive 4 at an interface A2 in the region A can be set lower than that between the peripheral region 102 and the adhesive 4 in the remaining portion. Therefore, a gap can be easily formed in the region B by applying a stress.

As a method of setting the surface roughness of the peripheral region 102 in the region A lower than that of the periph-eral region 102 in the remaining region, a method of roughening the remaining region, or a method of planarizing the region A by polishing, for example, is available.

In the above-mentioned example, the surface roughness of the first member 1 (peripheral region 102) in the region A is set lower than that of the first member 1 (peripheral region 102) in the remaining region. Instead of this, the surface roughness of a second member 5 in the region A may be set lower than that of the second member 5 in the remaining region.

As described above, although the surface roughness in the region A is preferably lower than that in the remaining region, the surface roughness in the region A is preferably sufficient to entrap particles. For example, the surface roughness in the region A is preferably equivalent to an arithmetic average roughness Ra of several microns. If the first member 1 is formed by a ceramic, the ceramic generally has a surface roughness of several microns, and is therefore preferably used intact as the region A. In this case, the remaining region is roughened.

Fifth Embodiment

The fifth embodiment of the present invention will be described with reference to FIGS. 7A to 7D. Note that details which are not particularly referred to in the fifth embodiment can be the same as in the first embodiment. In the fifth embodiment, in an adhering step (curing step), an adhesive is cured so that the curing level of the adhesive in the region, where a gap is to be formed, of a frame region where the adhesive is arranged is lower than that of the adhesive in the remaining region of the frame region. With this operation, in a stress applying step, a gap can be easily formed in the region where the gap is to be formed.

FIG. 7A is a plan view of a solid-state image sensor IS before the stress applying step, and FIG. 7B is a sectional view (a sectional view taken along a line X-X' in FIG. 7A) of the solid-state image sensor IS before the stress applying step. FIG. 7C is a plan view of the solid-state image sensor IS after the stress applying step, and FIG. 7D is a sectional view (a sectional view taken along a line X-X' in FIG. 7C) of the solid-state image sensor IS after the stress applying step.

A region A is the region, where a gap 7 is to be formed, of a frame region where an adhesive 4 is arranged. In the adhering step (curing step), the adhesive 4 is cured so that the curing level of the adhesive 4 in the region A of a frame region where the adhesive 4 is arranged is lower than that of the adhesive 4 in the remaining region of the frame region. A region B is the region where the adhesive 4 in the region A has peeled off a first member 1, that is, the gap 7 is formed.

At the start of the stress applying step, the curing level of the adhesive 4 in the region A is lower than that of the adhesive 4 in the remaining region, so the bonding strength between the adhesive 4, and the first member 1 and a second member 5 in the region A is lower than that in the remaining region. Therefore, in the stress applying step, the adhesive 4 can be easily peeled off the first member 1 and/or the second member 5 in the region A to form the gap 7.

Note that various methods can be adopted as a method of setting the curing level of the adhesive 4 in the region A lower than that of the adhesive 4 in the remaining region. If the adhesive 4 is an ultraviolet-curing resin, it can be irradiated with ultraviolet rays while, for example, the region A is covered with a translucent film. If the adhesive 4 is a thermoset resin, it can be heated while the region A is covered with a substance with a low thermal conductivity. The curing level can be evaluated using a thermal analysis method such as DSC (Differential Scanning Calorimetry) or TMA (Thermo-Mechanical Analysis). The curing level of the adhesive 4 in the region A at the start of the stress applying step can be, for example, 80% or less.

An uncured adhesive 4 may be cured after the gap 7 is formed in the stress applying step. Note that the adhesive 4 is a thermoset resin, and an uncured adhesive 4 is cured in the stress applying step when the stress applying step includes a heating step.

Sixth Embodiment

The sixth embodiment of the present invention will be described with reference to FIGS. 8A to 8D. Note that details which are not particularly referred to in the sixth embodiment can be the same as in the first embodiment. In the sixth embodiment, a liquid repellent treatment is performed for a second member 5 in the portion, where a gap is to be formed, of the region, where an adhesive is arranged, to weaken the bonding strength between the portion having undergone the liquid repellent treatment, and an adhesive 4. With this operation, in a stress applying step, a gap can be easily formed in the portion where the gap is to be formed.

Figure 8A:
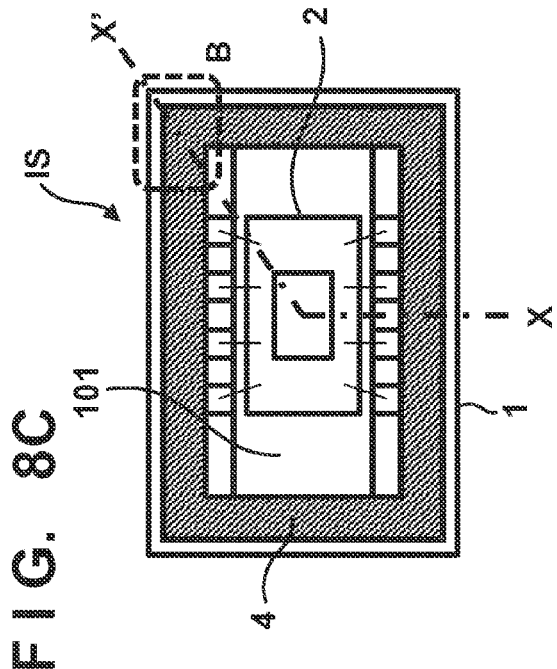
FIGS. 8A to 8D are views showing a semiconductor device and a method of manufacturing the same according to the sixth embodiment.
Figure 8B:
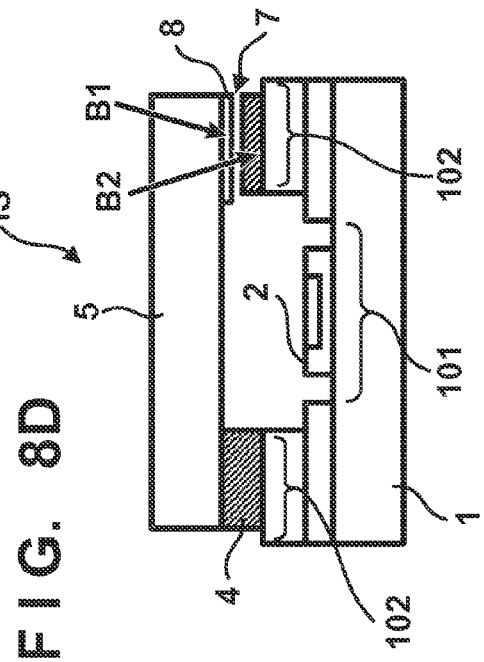
Figure 8C:
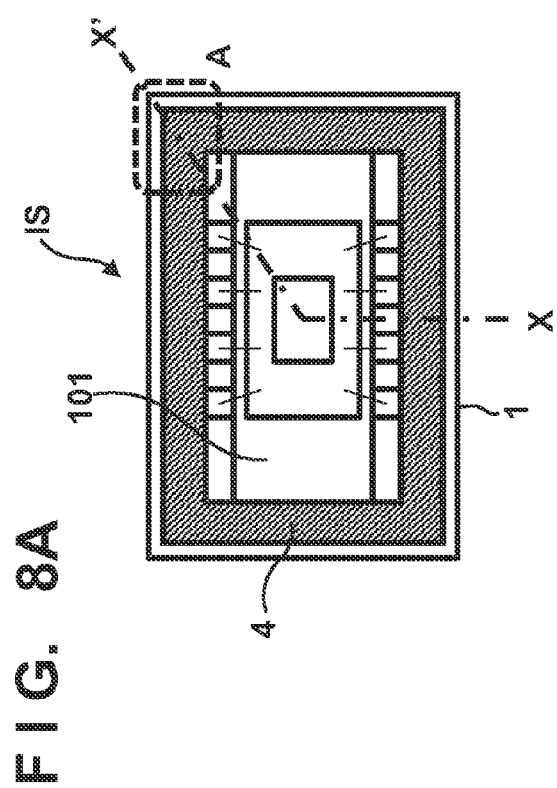
Figure 8D:
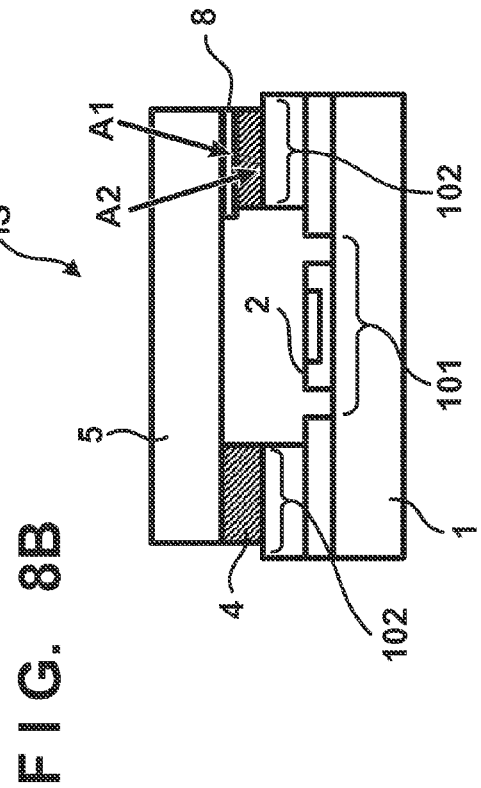

FIG. 8A is a plan view of a solid-state image sensor IS before the stress applying step, and FIG. 8B is a sectional view (a sectional view taken along a line X-X' in FIG. 8A) of the solid-state image sensor IS before the stress applying step. FIG. 8C is a plan view of the solid-state image sensor IS after the stress applying step, and FIG. 8D is a sectional view (a sectional view taken along a line X-X' in FIG. 8C) of the solid-state image sensor IS after the stress applying step.

A region A is the region, where a gap 7 is to be formed, of a frame region where the adhesive 4 is arranged. In the region A, a liquid repellent treatment is performed for the second member 5. A film 8 with liquid repellency is formed in the second member 5. A region B is the region where the adhesive 4 in the region A has peeled off the portion on the side of the second member 5 (film 8), that is, the gap 7 is formed.

As the film 8 with water repellency, a film with a contact angle of the adhesive 4 in the region A, which is larger than that of the adhesive 4 in the remaining region, can be used. Examples of such a film 8 include an AR (Anti-Reflection) coating containing fluorine on its top surface, and a silicone resin coating.

Although a liquid repellent treatment is performed for the second member 5 in the above-mentioned example, it may be performed for a first member 1.

Seventh Embodiment

The seventh embodiment of the present invention will be described with reference to FIGS. 9A, 9B, and 10A to 10D. Note that details which are not particularly referred to in the seventh embodiment can be the same as in the first embodiment. In the seventh embodiment, the surface of a peripheral region 102 is curved so that the interval between the peripheral region 102 and a second member 5 in the region, where a gap is to be formed, of a frame region where an adhesive is arranged is smaller than that between the peripheral region 102 and the second member 5 in the remaining region of the frame region. With this arrangement, the expected amount of deformation of an adhesive 4 in a region A where a gap 7 is to be formed is smaller than that in the remaining region, so the gap 7 can be easily formed in the region B. Also, it becomes easy to limit the region where the gap 7 is formed to fall within the region A.

Figure 9A:
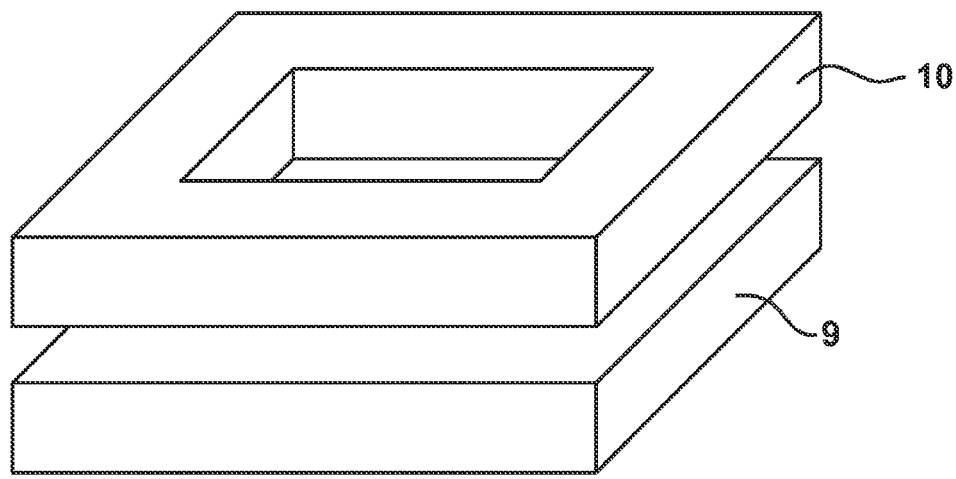
FIGS. 9A and 9B are views showing a semiconductor device and a method of manufacturing the same according to the seventh embodiment.

An exemplary method of forming a first member 1 having a peripheral region 102 with a curved surface will be described below with reference to FIGS. 9A and 9B. First, as shown in FIG. 9A, a plate-shaped member 9 and a frame-shaped member 10 are prepared. Although the plate-shaped member 9 and frame-shaped member 10 can be formed by, for example, a ceramic, glass epoxy, a resin such as plastic resin, or a metal, their materials can be selected so that the coefficient of linear expansion of the frame-shaped member 10 is larger than that of the plate-shaped member 9. For example, the plate-shaped member 9 can be formed by a ceramic substrate which has a coefficient of linear expansion of about 7 ppm and includes a wiring layer, and the frame-shaped member 10 can be formed by a metal having a coefficient of linear expansion of about 9 to 11 ppm.

Figure 9B:
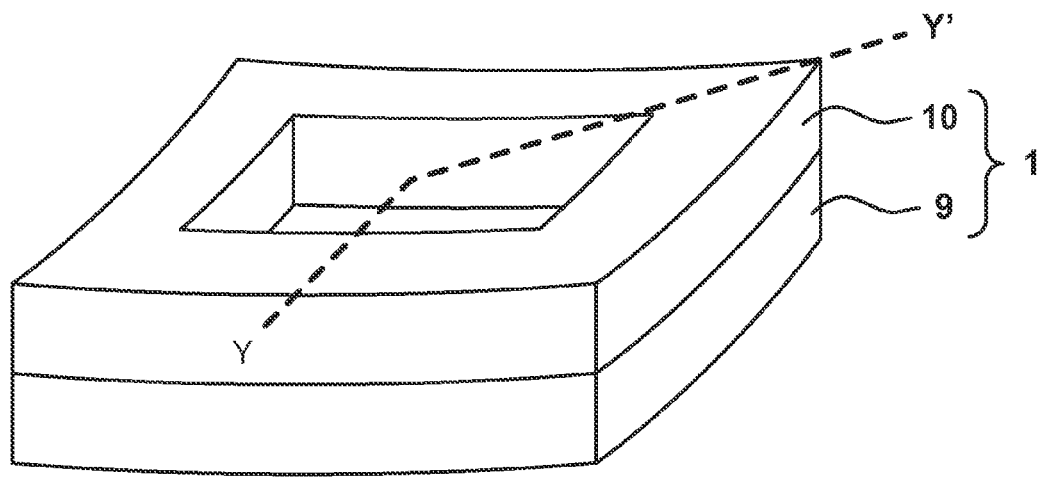

As shown in FIG. 9B, the plate-shaped member 9 and frame-shaped member 10 can be bonded to each other to form the first member 1. Note that the plate-shaped member 9 and frame-shaped member 10 can be bonded to each other by an adhesive made of a thermoset resin. In this case, when the plate-shaped member 9 and frame-shaped member 10 return to normal temperature after being heated for adhesion, the frame-shaped member 10, with a larger coefficient of linear expansion, contracts more than the plate-shaped member 9. As a result, the first member 1 formed by the plate-shaped member 9 and frame-shaped member 10 may curve so that the four corner portions of the frame-shaped member 10 project to the side opposite to the plate-shaped member 9.

A method of manufacturing a solid-state image sensor IS will be described below with reference to FIGS. 10A to 10D. FIGS. 10A to 10D show cross-sections taken along a line Y-Y' in FIG. 9B, in which the left side is the Y-side, while the right side is the Y'-side. The surface level of the right side (Y'-side), that is, the corner portion is higher than that of the left side (Y-side).

In a step shown in FIG. 10A, a solid-state image sensing chip 2 is mounted in a chip mounting region 101 of a first member 1. The solid-state image sensing chip 2 includes a pixel region 3 having a plurality of light receiving elements (photoelectric conversion elements).

An adhering step illustrated in FIGS. 10B and 10C is performed. First, in a step shown in FIG. 10B, an adhesive 4 is applied to a peripheral region 102 of the first member 1 to surround the entire periphery of the chip mounting region 101. Details of this step can be the same as in the first embodiment. In a step shown in FIG. 10C, a second member 5 is arranged on the first member 1 (arranging step). With this operation, a structure in which the adhesive 4 is arranged between the peripheral region 102 of the first member 1, and the second member 5 to surround the entire periphery of the chip mounting region 101 can be obtained. Again in the step shown in FIG. 10C, the adhesive 4 is cured to adhere the first member 1 and the second member 5 to each other (curing step).

As described earlier, in the peripheral region 102 of the first member 1, the surface level of the right side (Y'-side), that is, the corner portion is higher than that of the remaining region. Note that the corner portion is the portion where a gap 7 is to be formed. While the second member 5 is stacked on the first member 1, the thickness of the adhesive 4 at the corner portion is smaller than that of the adhesive 4 in the remaining region. That is, according to the seventh embodiment, a structure in which the thickness of the adhesive 4 at the corner portion, that is, in the region where the gap 7 is to be formed is smaller than that of the adhesive 4 in the remaining region can be obtained using a first member 1 formed in the steps illustrated in FIGS. 9A and 9B. In the seventh embodiment, the gap 7 can be formed at the corner portion in accordance with the same principle as in the third embodiment.

In a step shown in FIG. 10D, a stress is generated between the first member 1 and the second member 5 (stress applying step). With this operation, a gap 7 is locally formed in at least one of the portion between the first member 1 and the adhesive 4, and that between the second member 5 and the adhesive 4 to allow the internal space 6 of the peripheral region 102 to communicate with the external space of the peripheral region 102. A stress can be generated between the first member 1 and the second member 5 by, for example, heating at least one of the first member 1 and second member 5. For example, a stress can be generated by heating, in a heating furnace 31, a package including the first member 1 and second member 5 which accommodate the solid-state image sensing chip 2.

The above-mentioned first to seventh embodiments may be practiced by combining some or all of them with each other. A combination of the second and sixth embodiments, or a combination of the second and fourth embodiments, for example, is preferable.

The first member 1 may be formed by a plate member having the chip mounting region 101, a frame-shaped member having the peripheral region 102, and a second adhesive arranged in a frame shape to surround the entire periphery of the chip mounting region 101 of the plate member to bond the plate member and the frame-shaped member. In this case, the second member 5 may have a plate shape, or a concave portion in a portion opposed to the chip mounting region 101. The second member 5 may be formed by a plate member which covers a semiconductor chip, a frame-shaped member, and a second adhesive continuously arranged in a frame shape on the plate member to bond an outer plate member and the frame-shaped member with each other. In this case, the first member 1 may have a plate shape or a concave portion 103.

A gap can be locally formed in at least one of the portion between the above-mentioned plate member and the above-mentioned second adhesive, and that between the above-mentioned frame-shaped member and the above-mentioned second adhesive to allow the internal space 6 of the peripheral region 102 to communicate with the external space of the peripheral region 102.

Eighth Embodiment

Although an example in which a semiconductor device and a method of manufacturing the same according to the present invention are applied to a solid-state image sensor and a method of manufacturing the same has been given in the first to seventh embodiments, the present invention is also applicable to another type of semiconductor device and a method of manufacturing the same. A semiconductor device and a method of manufacturing the same according to the present invention are applicable to, for example, a semiconductor device (light emitting device) in which, for example, an LED chip is arranged in a package having a cavity.

Ninth Embodiment

An exemplary camera equipped with a solid-state image sensor according to each of the above-mentioned first to seventh embodiments will be described as an application example of the solid-state image sensor. The concept of the camera includes not only an apparatus mainly intended for image capture but also an apparatus (for example, a personal computer or a portable terminal) additionally provided with an image capture function. The camera includes a solid-state image sensor according to the present invention, as illustrated in each of the above-mentioned embodiments, and a processing unit which processes a signal output from the solid-state image sensor. The processing unit can include, for example, an A/D converter, and a processor which processes digital data output from the A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-153020, filed Jul. 6, 2012, which is hereby incorporated by reference herein in its entirety.

What is claimed is:

1. A semiconductor device comprising:
   a first member, including a chip mounting region and a peripheral region surrounding the chip mounting region;
   a semiconductor chip mounted in the chip mounting region;
   a second member which covers the semiconductor chip; and
   an adhesive arranged in a frame shape between the peripheral region and the second member to surround an entire periphery of the chip mounting region so as to bond the first member and the second member with each other,
   wherein a gap is locally formed between the adhesive and at least one of the first member and the second member to allow an internal space relative to the peripheral region to communicate with an external space relative to the peripheral region.

2. A semiconductor device comprising:
   a first member, including a chip mounting region and a peripheral region surrounding the chip mounting region;
   a semiconductor chip mounted in the chip mounting region;
   a second member which covers the semiconductor chip; and
   an adhesive arranged in a frame shape between the peripheral region and the second member to surround an entire periphery of the chip mounting region so as to bond the first member and the second member with each other,
   wherein a gap is locally formed between the adhesive and at least one of the first member and the second member to allow an internal space relative to the peripheral region to communicate with an external space relative to the peripheral region, and
   wherein a width of the adhesive at a region where the gap is formed is smaller than the adhesive at a region where the gap is not formed.

3. The device according to claim 1, wherein
   at least one of
   (e) a surface roughness of the first member in a region, where the gap is formed, of a frame region where the adhesive is arranged is lower than a surface roughness of the first member in another region of the frame region, and
   (f) a surface roughness of the second member in a gap forming region, where the gap is formed, of a frame region where the adhesive is arranged is lower than a surface roughness of the second member in another region of the frame region
   is satisfied.

4. The device according to claim 1, wherein
at least one of
(g) the first member has undergone a liquid repellent treatment in a gap forming region, where the gap is formed, of a frame region where the adhesive is arranged, and
(h) the second member has undergone a liquid repellent treatment in the gap forming region of the frame region
is satisfied.

5. The device according to claim 1, wherein an interval between the peripheral region and the second member in a gap forming region, where the gap is formed, of a frame region where the adhesive is arranged is smaller than an interval between the peripheral region and the second member in another region of the frame region.

6. The device according to claim 1, wherein the first member includes a plate member including the chip mounting region, a frame-shaped member including the peripheral region, and a second adhesive arranged in a frame shape to surround an entire periphery of the chip mounting region so as to bond the first member and the second member with each other.

7. The device according to claim 1, wherein the second member includes a plate member which covers the semiconductor chip, a frame-shaped member, and a second adhesive continuously arranged in a frame shape on the plate member so as to bond the plate member and the frame-shaped member with each other.

8. The device according to claim 6, wherein a gap is locally formed between the second adhesive and at least one of the plate member and the frame-shaped member, to allow the internal space relative to the peripheral region to communicate with the external space relative to the peripheral region.

9. The device according to claim 1, wherein the semiconductor chip includes a solid-state image sensing chip.

10. A camera comprising:
a semiconductor device defined in claim 9; and
a processing unit which processes a signal output from the semiconductor device.

11. The device according to claim 1, wherein the frame shape is a closed-loop shape to surround the entire periphery of the chip mounting region.

12. The device according to claim 1, wherein the frame shape is a rectangular shape, and the gap is formed at a corner portion of the rectangular shape.

* * * * *